United States Patent [19]
Lee

[11] Patent Number: 5,831,331
[45] Date of Patent: Nov. 3, 1998

[54] SELF-SHIELDING INDUCTOR FOR MULTI-LAYER SEMICONDUCTOR INTEGRATED CIRCUITS

[75] Inventor: Sheng-Hann Lee, Saratoga, Calif.

[73] Assignee: Philips Electronics North America Corporation, New York, N.Y.

[21] Appl. No.: 754,346

[22] Filed: Nov. 22, 1996

[51] Int. Cl.$^6$ .................................................. H01L 23/552
[52] U.S. Cl. ......................... 257/659; 257/277; 257/531; 257/665; 257/532
[58] Field of Search ................................... 257/277, 531, 257/659, 664, 665, 532

[56] References Cited

U.S. PATENT DOCUMENTS

| | | | |
|---|---|---|---|
| 5,095,357 | 3/1992 | Andoh et al. | 257/531 |
| 5,359,315 | 10/1994 | Inoue et al. | 336/200 |
| 5,396,101 | 3/1995 | Shiga | 257/531 |
| 5,398,400 | 3/1995 | Breen | 29/602.1 |
| 5,431,987 | 7/1995 | Ikeda | 257/531 |
| 5,446,311 | 8/1995 | Ewen et al. | 257/774 |
| 5,500,552 | 3/1996 | Ikeda et al. | 257/531 |
| 5,539,241 | 7/1996 | Abidi et al. | 257/531 |
| 5,559,360 | 9/1996 | Chiu et al. | 257/531 |
| 5,610,433 | 3/1997 | Merrill et al. | 257/531 |

FOREIGN PATENT DOCUMENTS

| | | | |
|---|---|---|---|
| 0413348A2 | 2/1991 | European Pat. Off. . | |
| 60-225449 | 11/1985 | Japan | 257/531 |
| 5-109923 | 4/1993 | Japan | 257/531 |

OTHER PUBLICATIONS

Burghartz et al, "Multilevel–Spiral Inductors Using VLSI Interconnect Technology" IEEE Electron Device Letters vol. 17 No. 9, Sep. 1996.

*Primary Examiner*—David Ostrowski
*Attorney, Agent, or Firm*—Steven R. Biren

[57] ABSTRACT

An inductive structure for an integrated circuit. The inductor has a first turn that shields the other turns of the inductor from a proximate ground plane. Multiple turns are disposed one above another in respective metalization layers of the integrated circuit. The turns are partial loops and are electrically coupled end-to-end with vias. Predetermined ones of the turns have additional portions in different layers. An additional portion of a turn is an electrically conductive strip deposited above the turn in a higher metalization layer and electrically coupled to the turn, thereby increasing the surface area of the turn and decreasing resistance of the turn. A buried n-type loop disposed below the first turn and below the surface of the substrate shields the first turn from the capacitive effects of the substrate.

21 Claims, 5 Drawing Sheets

SELF-SHIELDING INDUCTOR FOR MULTI-LAYER SEMICONDUCTOR INTEGRATED CIRCUITS

BACKGROUND OF THE INVENTION

1. Field of the Invention

The present invention generally relates to inductive structures, and more particularly, to inductors for use in integrated circuits.

2. Description of Background Art

Selection of suitable inductor structures for use in integrated circuits is a difficult undertaking. Not only must the inductive properties be considered, but manufacturability and space constraints must also be considered. For an inductor with given dimensions, the inductance is directly proportional to the square of the current density. Therefore, to increase inductance, it is customary to pack as many turns as possible into a given cross sectional area. However, because there are technological limits on the minimum width and spacing that can be achieved in constructing an integrated circuit, the number of inductor turns may be limited by the amount of available space.

European patent number EP 0 413 348 A2 to Mitsubishi (hereinafter, "Mitsubishi") describes various inductive structures. A first inductive structure is a two-dimensional spiral fabricated on a substrate. The spiral exhibits good inductive properties, however, the inductor structure occupies an undesirably large area of the available circuit area. Mitsubishi also describes a helical structure with an axis that is parallel to the substrate. Mitsubishi's helical inductor requires two vias per inductor turn, thus complicating the manufacturing process.

Therefore, it would be desirable to have an inductive structure that has desirable inductive qualities and which is easily manufactured.

SUMMARY OF THE INVENTION

The present invention is a self-shielding helical inductor for use in multiple metal layer integrated circuits. Multiple metal layers are used to equalize the resistance of the inductor turns.

The self-shielding inductor has a plurality of electrically insulating layers and a plurality of electrically coupled turns disposed between the insulating layers. A first turn of the inductor is fabricated within a metalization layer that is closest to the ground plane. The first turn of the inductor thereby shields the other turns from the electrical potential difference of the ground plane.

Because there is a relatively large difference in voltage potential between the turns of an inductor and a proximate ground plane, the ground plane causes a reduction in the effectiveness of the inductor as exhibited by a lower inductance. Because the first turn of the inductor is electrically in-phase with the other turns of the inductor, is placed nearer the ground plane than the other turns, and is placed directly below the other turns, the other turns are effectively shielded from the ground plane. The shielding provided by the first turn increases inductance of the inductor.

An n-type partial loop is buried below the oxidized surface of the substrate and below the first turn of the inductor to provide a capacitive shield. The buried loop is partial in that it does not completely surround an area. Because the n-type loop does not completely enclose an area, induction of an eddy current in the buried n-type loop is prevented.

The inductive properties of the inductor are enhanced by reducing the resistance of turns fabricated in the lower metal layers of the integrated circuit. To lower the resistance of a turn in a lower metal layer, a corresponding additional turn is fabricated in a higher metal layer, and the additional turn is electrically connected to the lower level turn. The additional turn in a higher metal layer increases the cross-sectional area of the lower level turn, thereby reducing the resistance of the turn.

DETAILED DESCRIPTION

Figure 1:
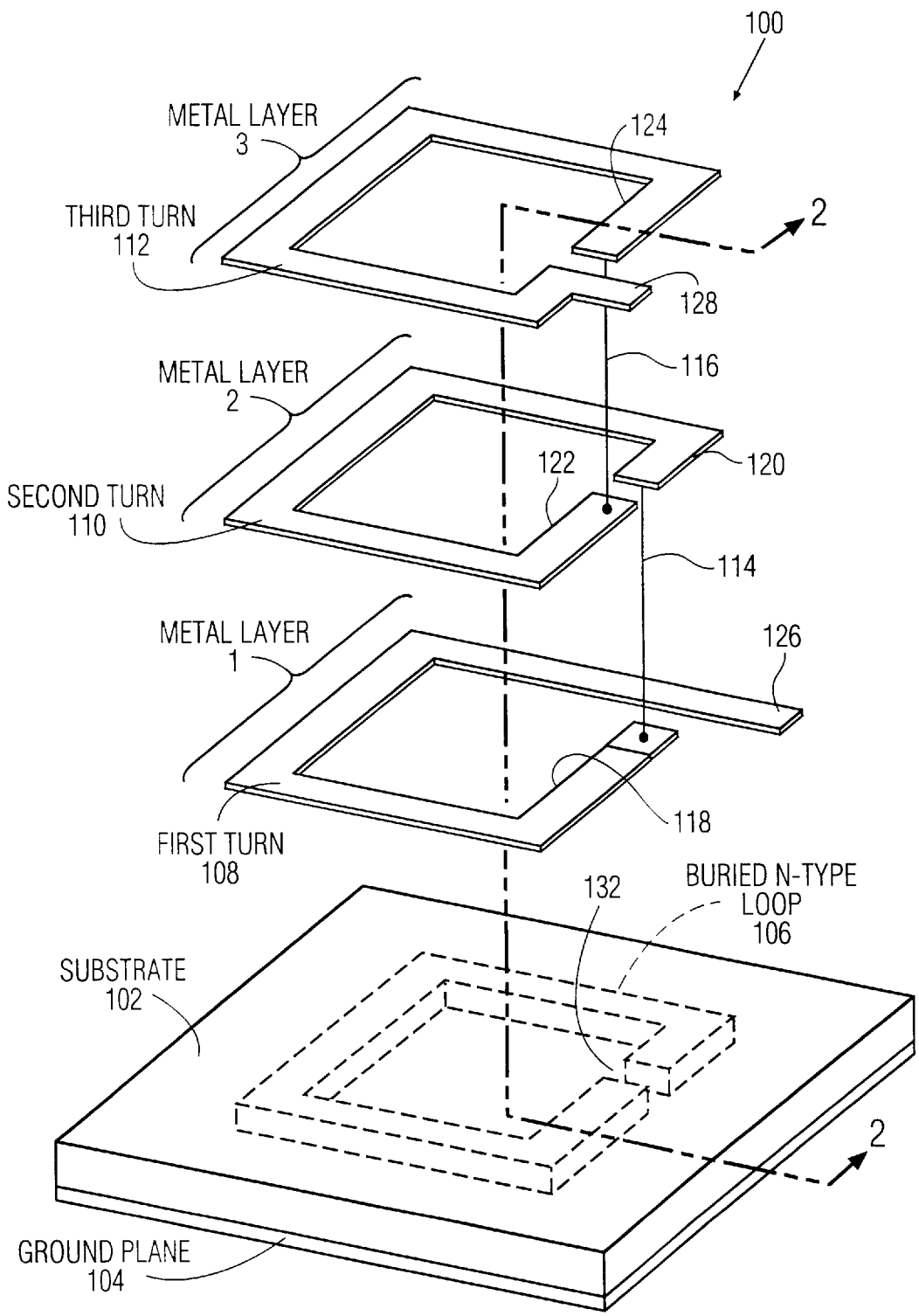
FIG. 1 is a perspective view of a first exemplary embodiment of the inductor of the present invention.

FIG. 1 is a perspective view of an exemplary first embodiment of the inductor of the present invention. The inductor 100 is shaped as a modified helix. The inductor is not a strict helix in that the turns do not form a curve and are, instead, generally rectangular. However, those skilled in the art will recognize that the turns of the inductor 100 could be formed into alternate shapes, all within the scope of the invention.

The inductor 100 includes a silicon substrate 102 deposited on a metal ground plane 104 and three metal layers shown as metal layer 1, metal layer 2, and metal layer 3. The substrate 102 includes a buried n-type loop 106 referred to as a shielding layer. For purposes of illustration, the insulating semiconductor layers between the metal layers 1, 2, 3 are not shown.

Each of the metal layers has a turn disposed on a respective insulating layer (insulating layers not shown). Metal layer 1 includes a first turn 108, metal layer 2 includes a second turn 110, and metal layer 3 includes a third turn 112. The term "turn" as used in this specification refers to the strip of electrically conductive material, such as aluminum, that is deposited on an electrically insulative layer such that the edge(s) of the turn do not completely circumscribe an area.

The turns 108, 110, and 112 together form the windings of inductor 100 and are electrically coupled with vias which form metal layer interconnections through the electrically insulative layers. A via, as represented by line 114 (referred to as "via 114"), electrically couples the first turn 108 to the second turn 110. The via 114 includes a via hole that penetrates the electrically insulative layer disposed between the first turn 108 and second turn 110. Similarly, via 116 electrically connects the second turn 110 to the third turn 112.

The first turn 108 has an end 118 disposed below an end 120 of the second turn 110 such that the ends 118 and 120 are electrically coupled by via 114. Similarly, end 122 of the second turn 110 is disposed below end 124 of the third turn 112 such that the ends 122 and 124 are electrically coupled with via 116.

The first turn 108 has an end 126 that is external relative to the turns 108, 110 and 112 of the helical inductor 100. The third turn 112 also has an external end 128. The external ends 126 and 128 are available to connect to circuitry which is external to the inductor 100.

The preferred length and width dimensions of the conductive strips of first turn 108 are such that projections of the edges of the second turn 110 and third turn 112 onto the metal layer 1 lie completely within the conductive strips of the first turn. An acceptable alternative is having the internal and external edges of the turns 108, 110, and 112 aligned such that they are flush one with another.

Relative to other inductor structures, the structure of the embodiment of the invention shown in FIG. 1 has the advantage of reducing the effects of a proximate ground plane 104 on the level of inductance. For a two-dimensional spiral inductor proximate to a ground plane, every turn of the spiral is exposed to the affects of the ground plane, thereby reducing the level of inductance for the spiral. For a helix which has an axis that is parallel to a substrate and which is proximate a ground plane, a portion of every turn is exposed to the affects of the ground plane, thereby reducing the level of induction.

In contrast to a spiral and a horizontal helix, the embodiment of the invention shown in FIG. 1 has an inductor 100 with only a first turn 108 exposed to a proximate ground plane 104. The helical inductor 100 has an axis that is preferably perpendicular to the ground plane. Because each of the turns 108, 110, and 112 are in phase and the helical inductor is perpendicular to the ground plane, the first turn 108 shields the second turn 110 and third turn 112 from the effects of the ground plane 104. The helical inductor 100, therefore, can achieve a higher inductance than a comparable spiral or horizontal helix.

Silicon is generally unpopular for use in building inductive structures because silicon causes signal loss. To reduce the signal loss, a partially conductive buried n-type loop 106 is fabricated beneath the surface of the substrate 102, below the first turn 108, and disposed in a loop that conforms to the shape of the first turn 108. An alternate approach to reducing the signal loss caused by the semiconductive substrate would be to have a metal strip disposed below the first turn 108. However, in the preferred embodiment, the metal strip is not feasible given that the three available metalization layers of the integrated circuit are used for the turns 108, 110, and 112 of the inductor 100.

The buried n-type loop 106 provides a capacitive shielding of the first turn 108 of the inductor 100 without creating an induction loop. Because the buried n-type loop 106 does not complete a loop, the structure prevents creation of an eddy current. As a result, high resistivity from the buried n-type loop 106 can be used without reducing the quality factor of the inductance. Those skilled in the art will recognize that the quality factor of the inductance=(energy stored/energy dissipated). The buried n-type loop 106 is inductively coupled to the first turn 108. Therefore, if the loop 106 were closed, it would cause a reduction in the inductance through the mutual inductance with the first turn. Additionally, the resistance of the buried n-type loop 106 would be inductively coupled to the first turn 108, thereby further lowering the quality factor of the inductance. The gap 132 illustrates that the buried n-type loop 106 does not complete a loop.

The length and width dimensions of the buried n-type loop 106 are preferably equal to the length and width dimensions of the first turn 108. If the buried n-type loop 106 extended into the interior area of the inductor 100, a signal loss would result because the magnetic field is inside the inductor. If the buried n-type loop 106 extended outside the inductor 100, the capacitance between the buried n-type loop and the substrate will increase and lower the quality factor of the inductance.

Figure 2:
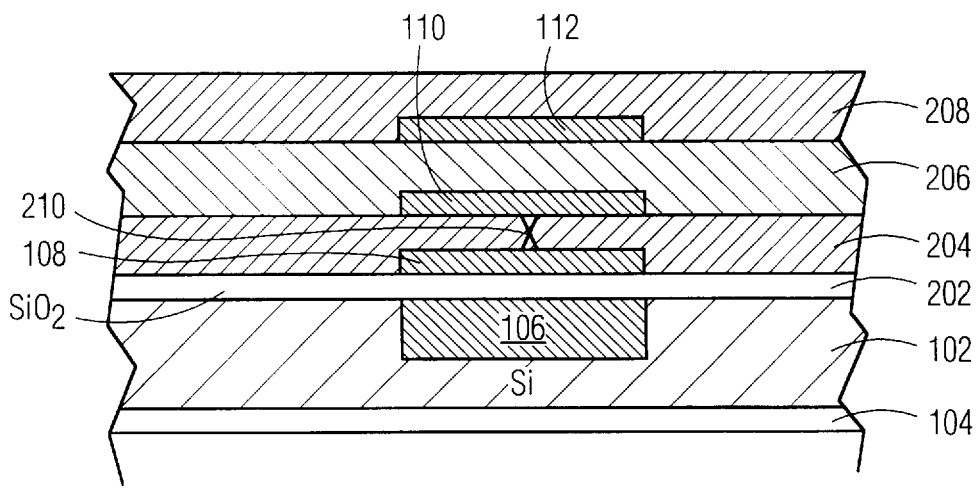
FIG. 2 is a partial cross-sectional view in the direction of arrow 2 of the inductor FIG. 1.

FIG. 2 is a partial cross-sectional view in the direction of arrow 2 of the inductor 100 of FIG. 1. The view shows cross-sections of the substrate 102, ground plane 104, buried n-type loop 106, first turn 108, second turn 110, and third turn 112. In addition, also shown are an oxidized layer 202 of the substrate 102, a first electrically insulating layer 204 disposed on layer 202 and covering the first turn 108, a second electrically insulating layer 206 disposed on layer 204 and covering the second turn 110, and a third insulating layer 208 disposed on the second layer 206 and covering the third turn 112. Via 210, represented by line 114 in FIG. 1, electrically couples the first turn 108 to the second turn 110.

In the exemplary structure, the first turn 108 is separated from the second turn 110 by 0.33 $\mu$m, and the second turn 110 is separated from the third turn 112 by 0.83 $\mu$m. The width of the turns 108, 110, and 112 is selected based on the space available and the desired level of inductance. The exemplary structure of FIG. 2 is 25 $\mu$m wide and 320 $\mu$m long. The height of the structure is dependent on the manufacturing process.

The substrate 102 is a silicon based p-type material, and the loop 106 is an n-type material. The structure of FIG. 2 may be produced using conventional integrated circuit fabrication methods. The widths of the turns 108, 110, 112 and the width of the buried n-type loop are approximately equal. In the exemplary embodiment, the buried n-type loop is 2.2 $\mu$m thick.

The exemplary inductor 100 has an inductance of approximately 11 nH with an inductance quality factor of approximately 9.

Figure 3:
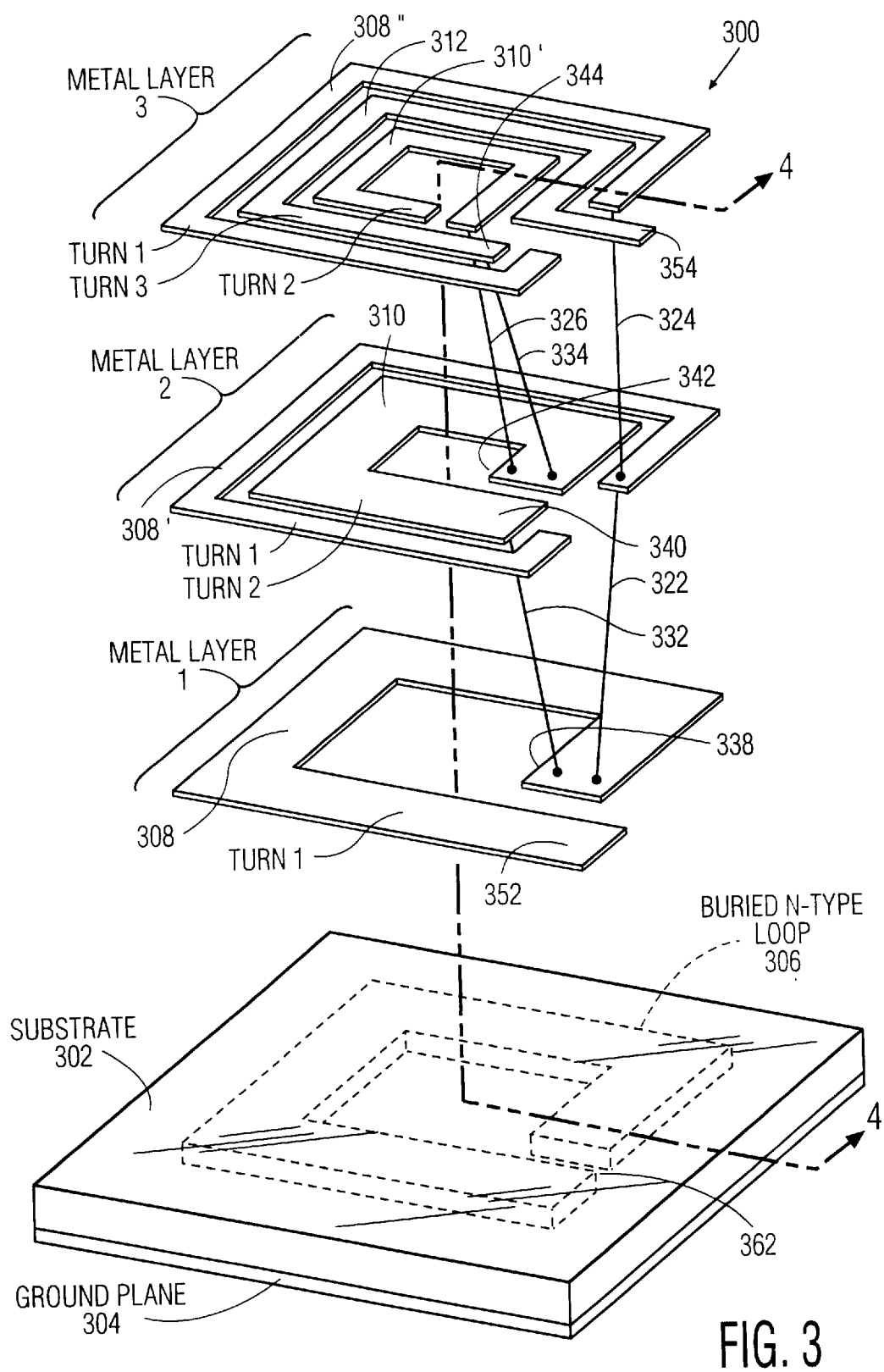
FIG. 3 is a perspective view of a second exemplary embodiment of the inductor according to the invention.

FIG. 3 is a perspective view of a second exemplary embodiment of the inductor 300 according to the invention. The structure of the inductor 300 equalizes the resistance between the turns of the inductor, provides a shield against the effects of a proximate ground plane, and provides a capacitive shielding of the inductor 300 to reduce signal loss without creating an induction loop.

Conventional processes for fabricating integrated circuits generally result in metal layer 1 being thinner than metal layer 2, and metal layer 2 being thinner than metal layer 3. The differences in thickness give rise to differences in resistance levels between the metal layers. For example, a first electrically conductive metal strip fabricated from the first metal layer will have a higher resistance than that of a corresponding strip fabricated from the second layer, for equal widths and lengths. The first metal strip has a higher resistance level because it has less cross-sectional area than the second strip. Because the quality factor of the inductance is inversely proportional to the overall resistance of the inductor, the thinner lower turn of a vertical helical inductor will reduce the quality factor of the inductance.

The inductor 300 of FIG. 3 is structured to minimize the usage of chip space and to equalize the resistance between the turns that form the inductor. The inductor 300 is shaped as a modified helix. The inductor is not a strict helix in that the turns do not form a curve and are, instead, generally rectangular. However, those skilled in the art will recognize that the turns of the inductor 300 could be formed into alternate shapes, all within the scope of the invention.

The inductor 300 includes a substrate 302 fabricated on a ground plane 304 and three metal layers shown as metal layer 1, metal layer 2, and metal layer 3. The substrate includes a buried n-type loop 306. For purposes of illustration, the insulating semiconductor layers between the metal layers 1, 2, 3 are not shown.

Each of the metal layers includes a turn fabricated on a respective insulating layer (not shown). Metal layer 1 includes a first turn 308, metal layer 2 includes a second turn 310, and metal layer 3 includes a third turn 312. None of the turns 308, 310, and 312 completely circumscribe an area.

To equalize the resistance between the turns 308, 310, and 312, the first turn 308 has a first portion 308' fabricated from metal layer 2 and a second portion 308" disposed on metal layer 3. Similarly, the second turn 310 has a portion 310' fabricated from metal layer 3. Because the first turn 308 is disposed in metal layer 1 and has the highest resistance of turns 308, 310, and 312, the first turn 308 has two additional portions: first portion 308' in metal layer 2 and second portion 308" in metal layer 3. The first turn 308 requires the additional portions 308' and 308" to reduce its resistance to that of the third turn 312. Similarly, the second turn 310 requires the portion 310' to equalize its resistance to that of the third turn 312. Utilizing the upper metal layers for the additional portions of the turns 308 and 310 reduces the chip space occupied by the inductor 300.

The first turn 308 is electrically coupled to the additional portion 308' by a via which is shown as line 322, and the additional portion 308' is electrically coupled to the additional portion 308" by a via which is shown as line 324. Similarly, the second turn 310 is electrically coupled to the additional portion 310' by a via which is shown as line 326.

The turns 308, 310, and 312 together form the windings of inductor 300. The turns 308, 310, and 312 are electrically coupled with vias in the electrically insulative layers. A via shown as line 332 electrically couples the first turn 308 to the second turn 310. Similarly, a via shown as line 334 couples the second turn 310 to the third turn 312.

The first turn 308 has an end 338 disposed below an end 340 of the second turn 310 such that the ends 338 and 340 are electrically coupled with via 332. Similarly, end 342 of the second turn 310 is disposed below end 344 of the third turn 312 such that the ends 342 and 344 are electrically coupled with via 334.

The first turn 308 has an end 352 that is external relative to the turns 308, 310 and 312 of the helical inductor 300. The third turn 312 also has an external end 354. The external ends 352 and 354 are available to connect to circuitry which is external to the inductor 300.

The preferred length and width dimensions of the conductive strips of first turn 308 are such that projections of the edges of portions 308' and 308", as well as portion 310' of the second turn 310, onto metal layer 1 lie completely within the conductive strips of the first turn 308. An acceptable alternative is having the external edges of the turns 308, 308', 308" aligned such that they are flush one with another and the internal edge of turn 308 aligned flush with the internal edges of the second turn 310 and portion 310'.

As with the embodiment of the invention shown in FIG. 1, the structure of inductor 300 reduces the effects of a proximate ground plane 304 on the level of inductance. Inductor 300 has only a first turn 308 exposed to a proximate ground plane 304. Because each of turns 310 and 312 are directly above turn 308 and each of the turns 308, 310, and 312 are electrically in phase, the first turn 308 shields the second turn 310 and third turn 312 from the effects of the ground plane 304.

The buried n-type loop 306 provides a capacitive shielding of the first turn 308 without creating an induction loop. Because the buried n-type loop 306 does not complete a loop, the structure prevents creation of an induction loop. The gap 362 illustrates that the buried n-type loop 306 does not form a complete loop. The length and width dimensions of the buried n-type loop 306 are preferably greater than or equal to the length and width dimensions of the first turn 308.

Figure 4:
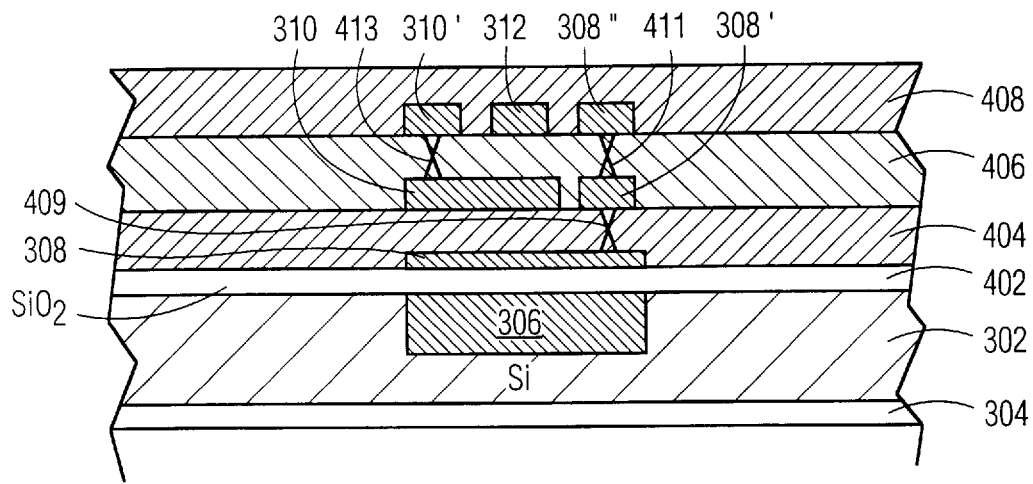
FIG. 4 is a cross-sectional view in the direction of arrow 4 of the inductor of FIG. 3.

FIG. 4 is a partial cross-sectional view in the direction of arrows 4 of the inductor 300 of FIG. 3. The view shows cross-sections of the substrate 302, ground plane 304, buried n-type loop 306, first turn 308 along with portions 308' and 308", second turn 310 along with portion 310', and third turn 312. In addition, also shown are an oxidized layer 402 of the substrate 302, a first electrically insulating layer 404 disposed on layer 402 and covering the first turn 308, a second electrically insulating layer 406 disposed on layer 404 and covering the second turn 310 and portion 308', and a third insulating layer 408 disposed on the second layer 406 and covering the third turn 312 and portions 308" and 310'.

FIG. 4 also illustrates via 409 that connects the first turn 308 with the portion 308' and the via 411 that connects portion 308' with portion 308". Via 413 connects the second turn 310 to portion 310'. For illustrative purposes, the vias that respectively connect the first turn 308 with the second turn 310 and the second turn 310 with the third turn 312 are omitted from FIG. 4.

In the exemplary embodiment, the minimum distance between metal traces in metal layer 1 is 1.6 $\mu$m, 2.0 $\mu$m in metal layer 2, and 2.0 $\mu$m in metal layer 3. The substrate 302 is a silicon based p-type material, and the loop 306 is an n-type material. The structure of FIG. 4 may be made using conventional methods.

The exemplary inductor 300 is 33 $\mu$m wide and 150 $\mu$m long. The inductance is 2.7 nH and the quality factor of the inductance is approximately 5.

Figure 5:
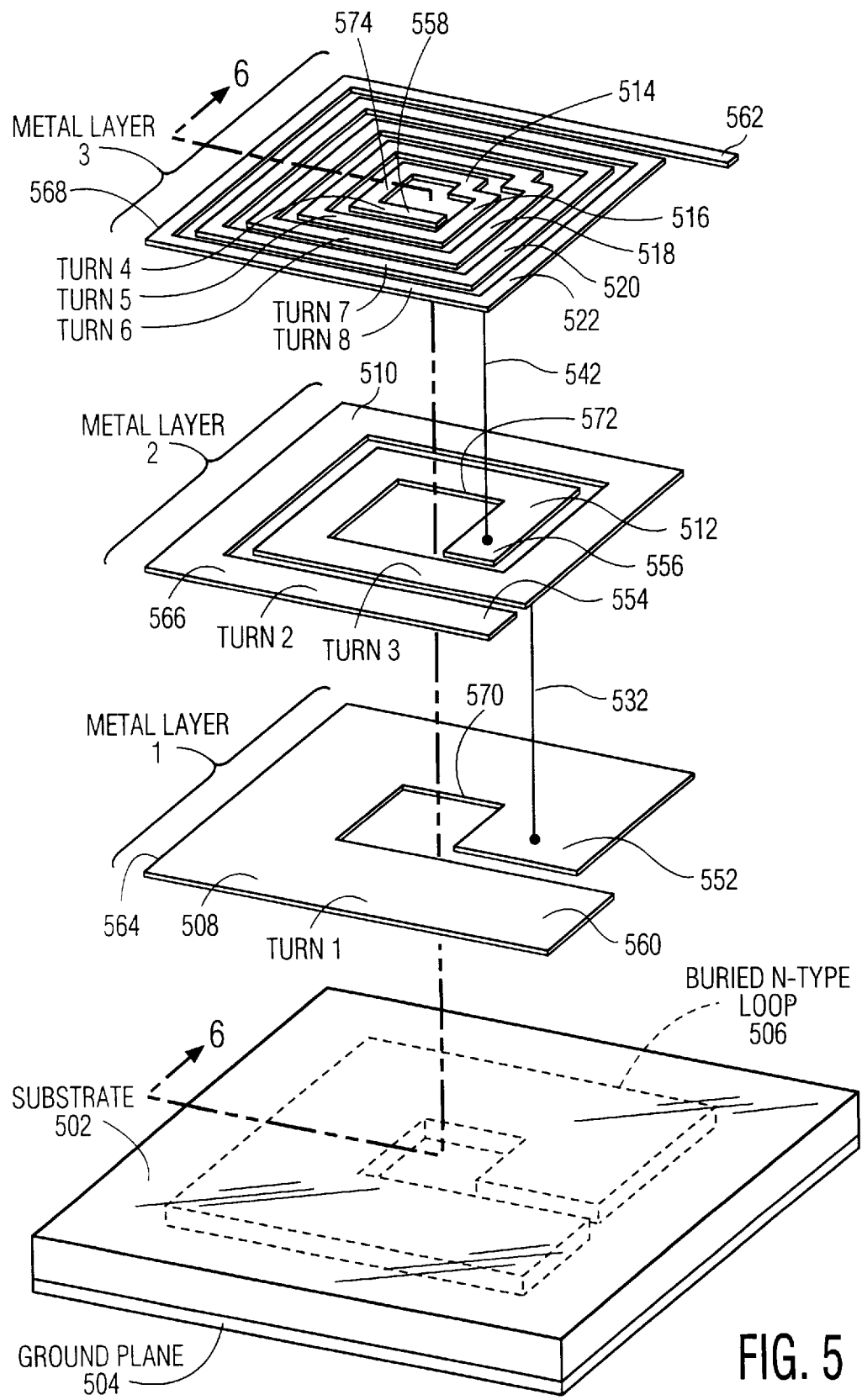
FIG. 5 is a perspective view of a third exemplary embodiment of the inductor according to the invention.

FIG. 5 is a perspective view of a third exemplary embodiment of the inductor 500 according to the invention. The structure of the inductor 500 has interconnected spirals in multiple metal layers as well as the features of the previous two embodiments.

The inductor 500 of FIG. 3 is structured to maximize inductance, minimize the usage of chip space and to equalize the resistance between the turns that form the inductor. The inductor 500 has multiple spirals on multiple metal layers.

The inductor 500 includes a substrate 502 fabricated on a ground plane 504 and three metal layers shown as metal layer 1, metal layer 2, and metal layer 3. The substrate includes a buried n-type loop 506. For purposes of illustration, the insulating semiconductor layers between the metal layers 1, 2, 3 are not shown. The inductor has eight turns labeled, Turn 1, Turn 2, . . . Turn 8. Those skilled in the art will recognize that more or fewer turns could be included to achieve various performance objectives.

Metal layer 1 has a single turn, metal layer 2 has a spiral with two turns, and metal layer 3 has a spiral with 5 turns. The first metal layer has first turn 508; the second metal layer has second turn 510 and third turn 512; and the third metal layer has fourth turn 514, fifth turn 516, sixth turn 518, seventh turn 520, and eighth turn 522.

To equalize the resistance between the turns 508–522, the turns have varying widths. To reduce the resistance of the first turn 508 (because it occupies the thinnest of the metal layers), it is made wider than the other turns. Similarly, the second turn 510 and third turn 512 are each wider than the fourth, fifth, sixth, seventh, and eighth turns 516–522 because the second turn and third turn occupy metal layer 2 which is thinner than metal layer 3.

The first turn 508 is electrically coupled to the second turn 510, which spirals into the third turn 512. A via, shown as line 532, electrically couples the first turn 508 to the second turn 510. The third turn is electrically coupled to the fourth turn 514 with a via which is shown as line 542.

The first turn 508 has an end 552 disposed below an end 554 of the second turn 510 such that the ends 552 and 554 are electrically coupled with via 532. Similarly, end 556 of the third turn 512 is disposed below end 558 of the fourth turn 514 such that the ends 556 and 558 are electrically coupled with via 542.

The first turn 508 has an end 560 that is external relative to the turns 508–522 of the inductor 500. The eighth turn 522 also has an external end 562. The external ends 560 and 562 are available to connect to circuitry which is external to the inductor 500.

The outer edge 564 of the first turn 508, the outer edge 566 of the second turn 512, and the outer edge 568 of the eighth turn 522 are aligned such that they are flush one with another. The referenced "edges" refer to all sides of the referenced turns given that they are generally embodied as rectangles. Similarly, interior edge 570 of the first turn 508 is flush with interior edge 572 of the third turn 512 which is flush with interior edge 574 of the fourth turn 514.

As with the embodiment of the invention shown in FIG. 1, the structure of inductor 500 reduces the effects of a proximate ground plane 504 on the level of inductance. Inductor 500 has only a first turn 508 exposed to a proximate ground plane 504. Because each of turns 510–522 are directly above turn 508 and the turns 508–522 are electrically in phase, the first turn 508 shields turns 510–522 from the effects of the ground plane 504.

The buried n-type loop 506 provides a capacitive shielding of the similar to that provided by the buried n-type loop 306 of FIG. 3. The length and width dimensions of the buried n-type loop 506 are preferably equal to the length and width dimensions of the first turn 508.

Figure 6:
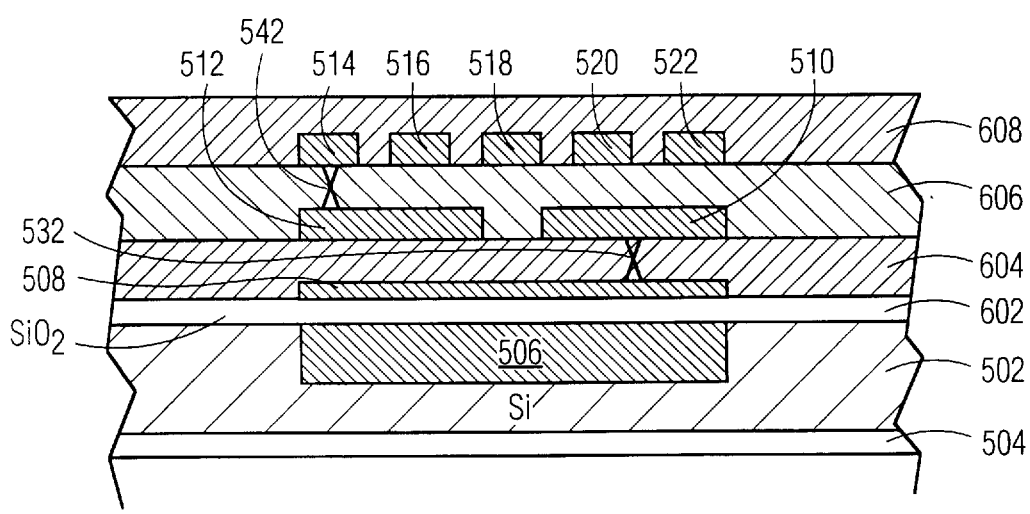
FIG. 6 is a cross-sectional view in the direction of arrow 4 of the inductor of FIG. 5.

FIG. 6 is a partial cross-sectional view in the direction of arrows 6 of the inductor 500 of FIG. 5. The view shows cross-sections of the substrate 502, ground plane 504, buried n-type loop 506, first turn 508, second turn 510, third turn 512, fourth turn 514, fifth turn 516, sixth turn 518, seventh turn 520, and eighth turn 522. In addition, also shown are an oxidized layer 602 of the substrate 502, a first electrically insulating layer 604 disposed on layer 602 and covering the first turn 508, a second electrically insulating layer 606 disposed on layer 604 and covering the second and third turns 510 and 512, and a third insulating layer 608 disposed on the second layer 606 and covering the fourth-eighth turns 514–522.

FIG. 6 also illustrates via 532 that connects the first turn 508 with the second turn and via 542 that connects the third turn 512 with the fourth turn 414. The materials for the substrate 502 and buried n-type loop 506, as well as the distance between metal traces are similar to that of the other embodiments.

The overall length and width of inductor 500 is approximately equal to that of inductor 300. Inductor 500 yields an inductance of 18 nH, and the quality factor of the inductance slightly reduced from that of the inductor 300.

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A self-shielding inductor for a semiconductor integrated circuit, comprising:

a plurality of electrically insulating layers; and an electrical conductor disposed in a plurality of electrically coupled turns, the turns disposed between the insulating layers of the semiconductor integrated circuit and including a first turn disposed between a first insulating layer and a second insulating layer, and others of the plurality of turns disposed between other ones of the insulating layers, the first turn being nearer a ground plane of the integrated circuit than the other turns.

2. The inductor of claim 1, further comprising a buried n-type layer disposed in a substrate of the integrated circuit between the first turn and the ground plane.

3. The inductor of claim 2, wherein the buried n-type layer has a shape that conforms to the first turn.

4. The inductor of claim 1, wherein the first turn has a width sufficient to shield the other turns.

5. A self-shielding inductor for a semiconductor integrated circuit, comprising:

a substrate having opposed first and second surfaces, the first surface disposed against a ground plane;

an electrical conductor disposed on the second surface of the substrate in a first turn, the first turn having a first end and a second end;

an first electrically insulating layer disposed on the second surface of the substrate and covering the first turn;

an electrical conductor disposed on the first insulating layer in a second turn and having a first end and a second end, the first end electrically coupled to the second end of the first turn;

an second electrically insulating layer disposed on the first insulating layer and covering the second turn; and an electrical conductor disposed on the second insulating layer in a third turn, the third turn having a first end and a second end electrically coupled to the second end of the second turn.

6. The inductor of claim 5, further comprising a buried n-type layer disposed beneath the second surface of the substrate and below the first turn.

7. The inductor of claim 6, wherein the buried n-type layer has a shape that conforms to the first turn.

8. The inductor of claim 5, wherein the first turn has a width sufficient to shield the other turns.

9. A self-shielding inductor with resistance equalization for a semiconductor integrated circuit, comprising:

a plurality of electrically insulating layers;

an electrical conductor disposed in a plurality of electrically coupled turns, the turns disposed between the insulating layers of the semiconductor integrated circuit and including a first turn disposed between a first insulating layer and a second insulating layer, and others of the plurality of turns disposed between other ones of the insulating layers, the first turn being nearer a ground plane of the integrated circuit than the other turns; and an electrical conductor disposed on the second insulating layer and electrically coupled to the first turn as a first additional layer of the first turn.

10. The inductor of claim 9, wherein the plurality of turns includes a second turn and a third turn, and the plurality of insulating layers includes a third insulating layer, the second turn electrically coupled to the first turn and disposed on the second insulating layer, the third insulating layer disposed on the second insulating layer and covering the second turn and the first additional layer of the first turn, and the third turn electrically coupled to the second turn and disposed on the third insulating layer, and further comprising:

an electrical conductor disposed on the third insulating layer and electrically coupled to the second turn as an additional layer of the second turn;

an electrical conductor disposed on the third insulating layer and electrically coupled to the first additional layer of the first turn as a second additional layer of the first turn.

11. The inductor of claim 10, further comprising a buried n-type layer disposed beneath the second surface of the substrate and below the first turn.

12. The inductor of claim 11, wherein the buried n-type layer has a shape that conforms to the first turn.

13. A self-shielding inductor with resistance equalization for a semiconductor integrated circuit, comprising:

a substrate having opposed first and second surfaces, the first surface disposed against a ground plane;

an electrical conductor disposed on the second surface of the substrate in a first turn, the first turn having a first end and a second end;

an first electrically insulating layer disposed on the second surface of the substrate and covering the first turn;

an electrical conductor disposed on the first insulating layer and electrically coupled to the second end of the first turn as a first additional layer of the first turn;

an electrical conductor disposed on the first insulating layer in a second turn and having a first end and a second end, the first end electrically coupled to the second end of the first turn;

an second electrically insulating layer disposed on the first insulating layer and covering the first additional layer of the first turn and the second turn; and an electrical conductor disposed on the second insulating layer in a third turn, the third turn having a first end and a second end electrically coupled to the second end of the second turn.

14. The inductor of claim 13, further comprising an electrical conductor disposed on the second insulating layer and electrically coupled to the second end of the second turn as an additional layer of the second turn.

15. The inductor of claim 14, further comprising an electrical conductor disposed on the second insulating layer and electrically coupled to the first additional layer of the first turn as a second additional layer of the first turn.

16. The inductor of claim 13, further comprising a buried n-type layer disposed between the first turn and the ground plane.

17. The inductor of claim 16, wherein the buried n-type layer has a shape that conforms to the first turn.

18. A self-shielding inductor for a semiconductor integrated circuit, comprising:

a substrate having opposed first and second surfaces, the first surface disposed against a ground plane;

an electrical conductor disposed on the second surface of the substrate in a first turn, the first turn having a first end and a second end;

an first electrically insulating layer disposed on the second surface of the substrate and covering the first turn; and an electrical conductor disposed in a first spiral on the first insulating layer and having a first end and a second end, the first end electrically coupled to the second end of the first turn.

19. The inductor of claim 18, further comprising:

an second electrically insulating layer disposed on the first insulating layer and covering the first spiral; and an electrical conductor disposed in a second spiral on the second layer and having a first end and a second end electrically coupled to the second end of the first spiral.

20. The inductor of claim 18, further comprising a buried n-type layer disposed between the first turn and the ground plane.

21. The inductor of claim 20, wherein the buried n-type layer has a shape that conforms to the first turn.

* * * * *